(12) United States Patent
Brgoch et al.

(10) Patent No.: US 11,788,006 B2
(45) Date of Patent: Oct. 17, 2023

(54) VIOLET LIGHT EXCITEABLE BLUE-EMITTING OXYNITRIDE PHOSPHORS AND USES THEREOF

(71) Applicant: University of Houston System, Houston, TX (US)

(72) Inventors: Jakoah Brgoch, Houston, TX (US); Shruti Hariyani, Houston, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/821,907

(22) Filed: Aug. 24, 2022

(65) Prior Publication Data

US 2023/0062497 A1 Mar. 2, 2023

Related U.S. Application Data

(60) Provisional application No. 63/236,260, filed on Aug. 24, 2021.

(51) Int. Cl.
C09K 11/77 (2006.01)

(52) U.S. Cl.
CPC ...... *C09K 11/7731* (2013.01); *C09K 11/7728* (2013.01); *C09K 11/7787* (2013.01); *C09K 11/7789* (2013.01); *C09K 11/77346* (2021.01)

(58) Field of Classification Search
CPC .......... C09K 11/7731; C09K 11/77346; C09K 11/7728; C09K 11/7787; C09K 11/7789
USPC ...................................................... 313/503
See application file for complete search history.

(56) References Cited

U.S. PATENT DOCUMENTS

| | | | | |
|---|---|---|---|---|
| 9,139,763 | B2* | 9/2015 | Winkler | C09K 11/77342 |
| 2013/0207538 | A1* | 8/2013 | Hirosaki | C09K 11/7746 |
| | | | | 313/503 |
| 2014/0332992 | A1* | 11/2014 | Hirosaki | C09K 11/08 |
| | | | | 264/21 |
| 2016/0028105 | A1 | 1/2016 | Khalifah et al. | |
| 2020/0326277 | A1* | 10/2020 | Schmidt | H01L 33/504 |

OTHER PUBLICATIONS

Conanec et al. "Les Phosphates Azotes Cristallises de Type Na3AlP3O9N et Na2Mg2P3O9N", Journal of Solid State Chemistry, 121(2), 418-422, Feb. 1, 1996.
Duke et al., "$Ba_3B_6O_{15}:Ce^{3+}$—A High Symmetry, Narrow-Emitting Blue Phosphor for Wide-Gamut White Lighting", *Chem. Mater.*, 30(8):2668-2675, 2018.
Hariyani and Brgoch, "Advancing Human-Centric LED Lighting Using $Na_2MgPO_4F:EU^{2+}$", *ACS Appl. Mater. Interfaces*, 13(14):16669-16676, 2021.
International Search Report and Written Opinion for PCT/US2022/075388 dated Nov. 24, 2022, 11 pages.
(Continued)

*Primary Examiner* — Christopher M Raabe
(74) *Attorney, Agent, or Firm* — Parker Highlander PLLC

(57) ABSTRACT

Provided herein are phosphors of the general molecular formula:

$$A_{3-2x}Eu_xMP_3O_9N,$$

wherein the variables are as defined herein. Methods of producing the phosphors are also provided. In some aspects, the present disclosure provides light-emitting devices comprising these phosphors.

20 Claims, 6 Drawing Sheets

(56) References Cited

OTHER PUBLICATIONS

Liao et al., "Learning from a Mineral Structure toward and Ultra-Narrow-Band Blue-Emitting Silicate Phosphor RbNa$_3$(Li$_3$SiO$_4$)$_4$:Eu$^{2+}$", *Angew. Chem. Int. Ed.*, 57(36):11728-11731, 2018.
Marchand et al., "Molecular, complex ionic, and solid state pon coumounds", *Adv. Inorg. Chem.*, 50:193-233, 2000.
Nagare et al., "Does iPad Night Shift mode reduce melatonin suppression?", *Lighting Research & Technology*, 51(3):373-383, 2019.
Nakamura et al., "High-power InGaN single-quantum-well-structure blue and violet light-emitting dio des", *Appl. Phys. Lett.*, 67(13):1868-1870, 1995.
Penning et al., *Energy Savings Forecast of Solid-State Lighting in General Illumination Applications*, 2016.
Park et al., "High-temperature transformation in KH2PO4 and RbH$_2$PO$_4$ crystals", *J. Phys.: Condens. Matter*, 13 9411-9419, 2001.
Prayag et al., "Light Modulation of Human Clocks, Wake, and Sleep", *Clocks Sleep*, 1(1):193-208, 2019.
Shannon, "Revised Effective Ionic Radii and Systematic Studies of Interatomic Distances in Halides and Chalcogenides", *Acta Cryst.*, A32, 751, 1976.
Schubert, et al., "Solid-State Light Sources Getting Smart", *Science*, 308, 1274-1278, 2005.

\* cited by examiner

VIOLET LIGHT EXCITEABLE BLUE-EMITTING OXYNITRIDE PHOSPHORS AND USES THEREOF

This application claims the benefit of priority to U.S. Provisional Application No. 63/236,260, filed on Aug. 24, 2021, the entire contents of which are hereby incorporated by reference.

FEDERAL GRANT SUPPORT

The invention was made with government support under Grant No. 1911311 awarded by the National Science Foundation. The government has certain rights in the invention.

BACKGROUND OF THE INVENTION

I. Field of the Invention

The present invention relates generally to the fields of chemistry and materials science. More particularly, it concerns blue-emitting phosphors as well as methods of making and light-emitting devices comprising said phosphors.

II. Description of Related Art

Replacing a traditional light bulb with an energy-efficient, phosphor-converted white light-emitting diode (pc-LED) is one of the most convenient and promising methods to decrease electricity consumption dramatically. Typically, white light is produced by combining a blue-emitting LED and a yellow and red-emitting phosphor such as $Y_3Al_5O_{12}$:$Ce^{3+}$ and $Sr_2Si_5N_8$:$Eu^{2+}$, respectively. The white light produced by these devices is cheap and functional, but the color-rendering is poor. Additionally, these devices' intense blue LED emission has been known to suppress melatonin production, the hormone essential for quality sleep, and cause circadian disruption, fatigue, and mood disorders. A "human-centric" light can be produced by using a violet LED chip combined with blue, green, and red-emitting phosphors. Unfortunately, most known blue-emitting phosphors cannot be efficiently excited by violet light.

Presently, only a few blue-emitting phosphors are compatible with violet LEDs. The most popular blue-emitter is $BaMgAl_{10}O_{17}$:$Eu^{2+}$ (BAM:$Eu^{2+}$). This material has been used in many applications ranging from domestic lighting to plasma display-based technologies due to its high efficiency in converting UV light to the visible (blue) region. Indeed, the PLAY of this industry-standard material approaches 100% under 365 nm excitation and is 90% with 400 nm excitation following years of optimization. The main drawback of this material is that it can be readily hydrolyzed and oxidized upon prolonged operation, causing drastic shifts in the emission wavelength and a decrease in the emission intensity. Another promising material is $Na_2MgPO_4F$:$Eu^{2+}$ which has a 70% photoluminescent quantum yield under 400 nm excitation and shows zero thermal quenching to 630 K. This material has a broad emission band of 79 nm (3782 $cm^{-1}$), which may inhibit some applications of this material. Finally, $RbNa_3(Li_3SiO_4)_4$:$Eu^{2+}$ has been successfully integrated into pc-LED devices but is composed of Rb, which makes producing devices out of this material expensive due to the scarcity of the alkali metal. Therefore, new rare-earth substituted inorganic blue-emitting phosphors composed of readily available elements with an efficient and thermally stable emission upon violet light excitation are urgently needed.

SUMMARY OF THE INVENTION

In some aspects, the present disclosure provides phosphors of the general molecular formula:

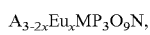

$$A_{3-2x}Eu_xMP_3O_9N,$$

wherein:
A is one or more alkali metal;
M is one or more elements selected from the group consisting of Al, Ga, In, Ti, V, Nb, Cr, Mn, Fe, Co, Sc, Y, La, Gd, and Lu; and $$0 < x \leq 0.25.$$

In some embodiments, A is potassium (I). In some embodiments, M is aluminum (III). In some embodiments, $0 < x \leq 0.1$, such as 0.03. In some embodiments, the phosphor is further defined as $K_{2.94}Eu_{0.03}AlP_3O_9N$.

In some embodiments, the phosphor at about 19° C. has an excitation spectrum peak at an excitation wavelength from about 260 nm to about 430 nm, such as about 400 nm. In some embodiments, the phosphor at about 19° C. has an emission spectrum peak at an emission wavelength from about 375 nm to about 600 nm, such as about 450 nm. In some embodiments, the emission spectrum peak has a full width at half-maximum (FWHM) of from about 2600 $cm^{-1}$ to about 2000 $cm^{-1}$, such as about 2110 $cm^{-1}$. In some embodiments, the emission spectrum peak has a full width at half-maximum (FWHM) of from about 55 nm to about 30 nm, such as about 45 nm. In some embodiments, the phosphor at about 21° C. has a photoluminescent quantum yield (PLQY) of greater than 5%, such as about 70%.

In other aspects, the present disclosure provides methods for producing a phosphor of the present disclosure, wherein the method comprises:
(a) mixing starting materials of the phosphor to produce a first reaction mixture, wherein the starting materials of the phosphor comprise one or more alkali metal sources, one or more metal sources, wherein each metal source is independently a transition metal source or a post-transition metal source, a phosphorous source, and a europium source; and
(b) heating the first reaction mixture to a first temperature for a first time period in the presence of a nitrogen source to produce the phosphor.

In some embodiments, the alkali metal source is a potassium source, such as a potassium salt, such as $KPO_3$. In some embodiments, the metal source is a post-transition metal source, such as an aluminum source, such as $Al_2O_3$. In some embodiments, the phosphorous source is a phosphate salt, such as $KPO_3$. In some embodiments, the europium source is a europium oxide, such as $Eu_2O_3$. In some embodiments, the first temperature is from about 100° C. to about 200° C., such as about 150° C. In some embodiments, the method further comprises heating the first reaction mixture to a second temperature. In some embodiments, the second temperature is from about 700° C. to about 900° C., such as about 800° C. In some embodiments, heating is performed at a rate of less than about 10° C. per minute, such as about 5° C. per minute. In some embodiments, the nitrogen source is $NH_3$, PON, $HPN_2$, binary metal nitrides, $(PNCl_2)_3$, or $Na_2NCN$.

In still other aspects, the present disclosure provides light-emitting devices comprising:
(a) an excitation light source that emits primary light; and
(b) a phosphor of the present disclosure.

In some embodiments, the excitation light source is a semiconductor light source, such as a light-emitting diode (LED) or a laser diode (LD). In some embodiments, the primary light has a wavelength from about 260 nm to about 450 nm, such as about 405 nm. In some embodiments, the light-emitting device further comprises a green-emitting phosphor, a red-emitting phosphor, or a combination thereof.

Other objects, features, and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description. Note that simply because a particular compound is ascribed to one particular generic formula doesn't mean that it cannot also belong to another generic formula.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

FIG. 3A shows the crystal structure of $K_3AlP_3O_9N$. (FIG. 3B) The three crystallographically independent $K^+$ sites serve as the $Eu^{2+}$ substitution site.

(FIG. 4A) The excitation and emission spectra of $K_{2.94}Eu_{0.03}AlP_3O_9N$. Various excitation wavelengths, 365 nm, 390 nm, 400 nm, and 415 nm, were utilized to illustrate how the emission spectrum narrows as the excitation wavelength increases. (FIG. 4B) The full width at half maximum (fwhm) of the emission spectrum of $K_3AlP_3O_9N:Eu^{2+}$ and industry-grade $BaMgAl_{10}O_{17}:Eu^{2+}$ as a function of excitation wavelength.

(FIG. 5A) The photoluminescent quantum yield of $K_{2.94}Eu_{0.03}AlP_3O_9N$ upon 365 nm, 390 nm, 400 nm, and 415 nm excitation. (FIG. 5B) The 1931 CIE coordinates of $K_3AlP_3O_9N:Eu^{2+}$ (KAPON:$Eu^{2+}$; circle; $\lambda_{ex}$=400 nm) lie closer to the deep-blue corner of the Rec. 2020 (thick black line) than both industry-grade $BaMgAl_{10}O_{17}:Eu^{2+}$ (square; $\lambda_{ex}$=400 nm), and a blue LED (x).

(FIG. 6A) The emission spectra of $K_{2.94}Eu_{0.03}AlP_3O_9N$ under 400 nm excitation from 300 K (black) to 640 K (grey). (FIG. 6B) The CIE coordinates of the emission spectra at 300 K, 400 K, 500 K, and 600 K all lie within a three-step MacAdam ellipse indicating emission color is invariant as a function of increasing temperature when observed by the average human eye. (FIG. 6C) The normalized, integrated intensity of the emission spectra plotted as a function of temperature.

DESCRIPTION OF ILLUSTRATIVE EMBODIMENTS

The present disclosure provides phosphors that efficiently emit blue light, methods for their manufacture, and light-emitting devices comprising said phosphors. In some embodiments, the phosphors exhibit more preferable excitation wavelengths and improved stability relative to other phosphors in the art. In some embodiments, the phosphors provided herein emit blue light in a narrower band than other phosphors in the art. The methods of producing the phosphors provided herein may be performed at atmospheric pressure and may be performed under a reducing atmosphere. In some embodiments, the phosphors may be used in lighting applications. The phosphors provided herein may possess emission coordinates that provide a color gamut more suitable to lighting applications than phosphors in the art. In some embodiments, the phosphors may be used for converting UV or violet light to blue light for use with a light-emitting diode (LED), laser diode (LD), or liquid crystal display (LCD), and a lighting or display apparatus employing the same. In some embodiments, the phosphor is $K_{2.94}Eu_{0.03}AlP_3O_9N$.

Lighting accounts for 15% of global energy consumption and solid-state lighting is quickly becoming one of the most convenient and affordable methods to dramatically increase energy savings (Penning, 2016). Solid-state lighting is currently replacing traditional incandescent and fluorescent light bulbs due to their higher efficiencies, longer operating lifetimes, and environmentally benign components. These devices produce white light from a monochromatic LED chip and inorganic phosphor. The most common devices available in stores today consist of a blue InGaN LED chip ($\lambda_{em}$≈450 nm) with a yellow-emitting phosphor, such as $Ce^{3+}$ substituted yttrium aluminum garnet. The phosphor absorbs and down-converts the LED's emission to longer wavelengths to cover the majority of the visible spectrum to appear as white light. The lack of a red spectral component, however, creates a blue-tinted white light with a low color rendering index (CRI<75) and high correlated color temperature (CCT>4500K) that successfully reproduces daylight indoors (Schubert and Kim, 2005). Warmer white lights have been produced by masking the blue LED emission by adding a second red-emitting phosphor such as $Sr_2Si_5N_8$:$Eu^{2+}$. These devices are commonly used at night to mimic the warmer color of the evening sun (CCT≈2700 K).

Figures 1A, 1B:
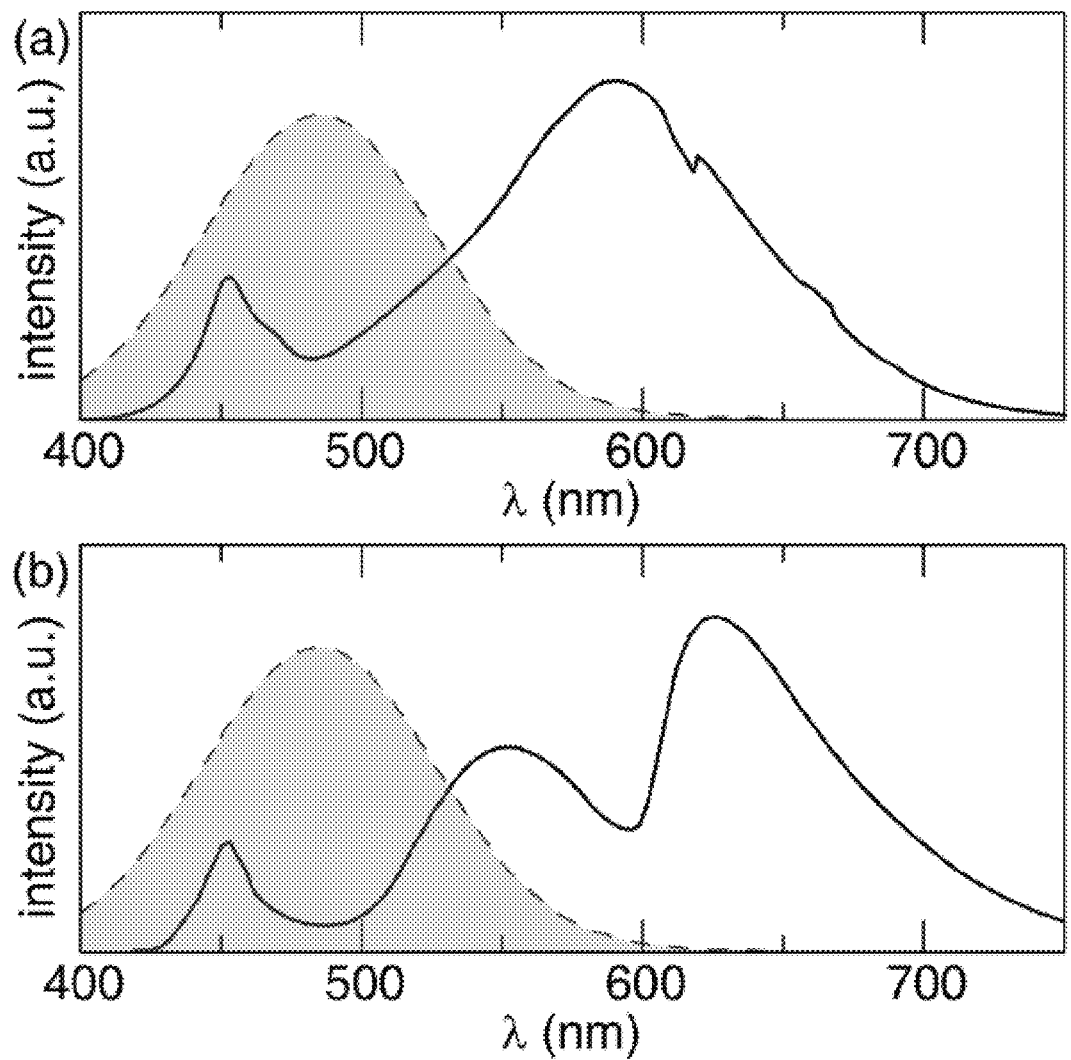
FIGS. 1A & 1B shows the emission spectra from (FIG. 1A) a commercial LED light bulb and (FIG. 1B) Night Shift on an Apple iPad© overlap with a wavelength-dependent melatonin suppression curve due to the use of a blue LED.

However, the prevalence of LED light bulbs powered by blue LED chips has been recently linked to increased rates of circadian disruption, insomnia, and fatigue (Prayag et al., 2019). Indeed, the residual blue light in these devices activates humans' intrinsic photosensitive retinal ganglion cells to trigger the production of cortisol and dopamine and suppress the production of melatonin to keep humans alert and awake during the day (Mure et al., 2019). As seen in FIG. 1A, the light from a commercial LED bulb has intense blue emission that overlaps with the maximum of a wavelength-dependent melatonin suppression (grey, dashed) curve, meaning exposure to these bulbs will cause humans to remain alert and awake during the day (Hariyani et al., 2021). However, humans' continued exposure to blue light at nighttime through LED light bulbs and LED-based televisions and display screens (iPhones, etc.) can lead to chronic melatonin suppression, causing numerous physiological and psychological effects. Modifications in background display lighting have been introduced in many devices such as Night Shift by Apple Inc. to combat the 'blue light hazard,' but a blue LED is still used as the excitation source. An example of the white light spectrum produced by Night Shift is provided in FIG. 1B, where the intense blue LED emission can be seen. Studies have shown that the use of Night Shift in Apple iPads© on high brightness still results in ≈10% melatonin suppression upon only one hour of exposure (Nagare et al., 2019). The color rendering using Night Shift is also poor, which may also contribute to hesitancy in utilizing these modifications.

Alternatively, the intensity of blue light in LED devices can be readily minimized by utilizing a violet LED as the excitation source. A violet LED coupled with red, green, and blue-emitting phosphors can produce a color-tunable white light with higher color rendering than blue LED-driven devices while simultaneously reducing exposure to high-intensity blue light (Nakamura et al., 1995). This light, called a 'human-centric white light', can produce a high-quality light with minimal risk to humans One limiting factor of widespread conversion to human-centric lighting is the lack of blue-emitting phosphors compatible with violet LEDs. Indeed, the blue-emitting phosphor used in these devices should have a highly efficient and thermally and chromatically stable emission upon violet light excitation.

Presently, only a few blue-emitting phosphors satisfy these criteria and are immediately applicable for human-centric lighting. The most popular blue-emitting material is the industry standard $BaMgAl_{10}O_{17}:Eu^{2+}$ ($BAM:Eu^{2+}$). This phosphor has been historically used in fluorescent and display lighting due to its high efficiency of 95% upon 340 nm excitation (Duke et al., 2018). Upon 365 nm excitation, the efficiency approaches 100% and decreases slightly to 90% with 400 nm excitation. The phosphor also possesses a moderately narrow emission with a full width at half maximum (fwhm) of 51 nm (2532 cm$^{-1}$). The main drawback of this material is that the emission spectrum of commercially purchased BAM: $Eu^{2+}$ has been reported to red-shift and broadens by ≈205 cm$^{-1}$ (4.5 nm) upon long term water and high-temperature exposure (Hariyani et al., 2021). Another promising material is $Na_2MgPO_4F:Eu^{2+}$ which has a 70% photoluminescent quantum yield under 400 nm excitation and shows zero thermal quenching to 630 K. This material has a broad emission band of 79 nm (3782 cm$^{-1}$), which may inhibit some applications of this material (Hariyani et al., 2021). Finally, $RbNa_3(Li_3SiO_4)_4:Eu^{2+}$ has been successfully integrated into pc-LED devices but is composed of Rb, which makes producing devices out of this material expensive due to the scarcity of the alkali metal (Liao et al., 2018). Therefore, new rare-earth substituted inorganic blue-emitting phosphors composed of readily available elements with long-wavelength excitation and thermally stable emission are urgently needed.

This technology described here is a new composition of matter based on $(A_{3-2x}Eu_xMP_3O_9N$ (A=Li, Na, K, Rb; M=Al, Ti, V, Cr, Mn, Fe, Ga, In; x=0-0.25). In some embodiments, such as $K_{2.94}Eu_{0.03}AlP_3O_9N$, these phosphors emit in the blue region of the electromagnetic spectrum when excited with near-UV or blue light. The material is composed of cheap, readily available, non-toxic elements. It can be synthesized with a simple one-step solid-state reaction under normal atmospheric pressure, making large-scale production viable (Conanec et al., 1996). The $(A_{3-2x}Eu_xMP_3O_9N$ (A=Li, Na, K, Rb; M=Al, Ti, V, Cr, Mn, Fe, Ga, In; x=0-0.25) phosphors are highly efficient and are thermally robust under violet light excitation, making them suitable candidates for human-centric LED lighting, but also for backlighting or general white lighting applications.

I. COMPOUNDS OF THE PRESENT DISCLOSURE

The compounds of the present disclosure (also referred to as "phosphors," "phosphors of the present invention" or "phosphors disclosed herein") are shown, for example, above, in the summary of the invention section, in the Examples below, and in the claims below. They may be made using the synthetic methods outlined in the Examples section. These methods can be further modified and optimized using the principles and techniques of inorganic chemistry as applied by a person skilled in the art. Such principles and techniques are taught, for example, in Cotton and Wilkinson, *Advanced Inorganic Chemistry*, (1988), which is incorporated by reference herein. In addition, the synthetic methods may be further modified and optimized for preparative, pilot- or large-scale production, either batch or continuous, using the principles and techniques of process chemistry as applied by a person skilled in the art.

In some embodiments, the compounds of the present invention have the advantage that they may be more efficacious than, more efficient than, more sensitive than, more efficiently manufactured than, more thermally, chemically, or photolytically stable than, have a better photochemical profile (e.g., narrower emission band, higher optical yield, and/or shorter emission lifetime) than, and/or have other useful physical or chemical properties over, compounds known in the prior art, whether for use in the applications stated herein or otherwise.

Atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$.

In some embodiments, the phosphors of the present disclosure are of the general molecular formula:

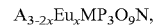

$$A_{3-2x}Eu_xMP_3O_9N,$$

wherein:

A is one or more alkali metal;

M is one or more elements selected from the group consisting of Al, Ga, In, Ti, V, Nb, Cr, Mn, Fe, Co, Sc, Y, La, Gd, and Lu; and $$0<x\leq0.25.$$

In some embodiments, A is a single alkali metal. In some embodiments, A is potassium such as potassium(I). In some embodiments, 0≤x≤0.25, or any range derivable therein. In further embodiments, 0<x≤0.15. In still further embodiments, 0<x≤0.10. In yet further embodiments, 0<x≤0.05, such as 0.03. In some embodiments, the phosphor is further defined as $K_{2.94}Eu_{0.03}AlP_3O_9N$. In some embodiments, a crystalline sample of the phosphor has a space group of P2$_1$3 (cubic, space group no. 198). In some embodiments, the phosphor has an excitation spectrum peak at an excitation wavelength from about 260 nm to about 430 nm, from about 260 nm to about 290 nm, or from about 260 nm, 265 nm, 270 nm, 275 nm, 300 nm, 325 nm, 330 nm, 335 nm, 340 nm, 345 nm, 350 nm, 365 nm, 375 nm, 385 nm, 390 nm, 395 nm, 400 nm, 405 nm, 410 nm, 415 nm, 425 nm, to about 430 nm, or any range derivable therein. In some embodiments, the phosphor has an emission spectrum peak at an emission wavelength from about 375 nm to about 600 nm, from about 425 nm to about 475 nm, or from about 375 nm, 390 nm, 400 nm, 410 nm, 420 nm, 430 nm, 440 nm, 450 nm, 460 nm, 470 nm, 480 nm, 490 nm, 500 nm, 525 nm, 550 nm, 575 nm, to about 600 nm, or any range derivable therein. In some embodiments, the emission spectrum peak has a full width at half-maximum (FWHM) of from about 30 nm to about 55 nm, from about 40 nm to about 50 nm, or from about 30 nm, 35 nm, 40 nm, 41 nm, 42 nm, 43 nm, 44 nm, 45 nm, 46 nm, 47 nm, 48 nm, 49 nm, 50 nm, to about 55 nm, or any range derivable therein. In some embodiments, the emission spectrum peak has a full width at half-maximum (FWHM) of from about 2000 $cm^{-1}$ to about 2600 $cm^{-1}$, from about from about 2050 $cm^{-1}$ to about 2150 $cm^{-1}$, or from about 2000 $cm^{-1}$, 2030 $cm^{-1}$, 2060 $cm^{-1}$, 2070 $cm^{-1}$, 2080 $cm^{-1}$, 2090 $cm^{-1}$, 2100 $cm^{-1}$, 2110 $cm^{-1}$, 2120 $cm^{-1}$, 2130 $cm^{-1}$, 2140 $cm^{-1}$, 2150 $cm^{-1}$, 2160 $cm^{-1}$, 2200 $cm^{-1}$, 2300 $cm^{-1}$, 2400 $cm^{-1}$, 2500 $cm^{-1}$, to about 2600 $cm^{-1}$, or any range derivable therein. In some embodiments, the photoluminescence quantum yield (PLQY) of the phosphor upon excitation at 365 nm and 21° C. is greater than about 5%, greater than about 50%, from about 85% to about 95%, or from about 5%, 10%, 15%, 20%, 25%, 30%, 35%, 40%, 45%, 50%, 55%, 60%, 65%, 70%, 75%, 80%, 85%, 90%, 95%, to about 99.9%, or any range derivable therein. In some embodiments, the PLQY of the phosphor upon excitation at 400 nm and 21° C. is greater than about greater than about 5%, greater than about 40%, from about 50% to about 80%, or from about 5%, 10%, 15%, 20%, 25%, 30%, 35%, 40%, 45%, 50%, 55%, 56%, 57%, 58%, 59%, 60%, 61%, 62%, 63%, 64%, 65%, 70%, 75%, 80%, 85%, 90%, 95%, to about 99.9%, or any range derivable therein.

II. METHODS OF PRODUCING PHOSPHORS OF THE PRESENT DISCLOSURE

In other aspects, the present disclosure provides methods for producing a phosphor of the present disclosure, wherein the method comprises:
(a) mixing starting materials of the phosphor to produce a first reaction mixture, wherein the starting materials of the phosphor comprise one or more alkali metal sources, one or more metal sources, wherein each metal source is independently a transition metal source or a post-transition metal source, a phosphorous source, and a europium source; and
(b) heating the first reaction mixture to a first temperature for a first time period in the presence of a nitrogen source to produce the phosphor.

In some embodiments, the starting materials of the phosphor comprise a single alkali metal source. In some embodiments, the alkali metal source is a potassium source. In some embodiments, the potassium source is a potassium salt, such as $KPO_3$. In some embodiments, the metal source is a post-transition metal source. In further embodiments, the post-transition metal source is an aluminum source, such as $Al_2O_3$. In some embodiments, the phosphorous source is a phosphate salt, such as $KPO_3$. In some embodiments, the europium source is a europium oxide, such as europium (III) oxide. In some embodiments, the nitrogen source is $NH_3$, PON, $HPN_2$, binary metal nitrides, $(PNCl_2)_3$, or $Na_2NCN$. In some embodiments, the first temperature is from about 100° C. to about 200° C., from about 125° C. to about 175° C., or from about 100° C., 110° C., 120° C., 130° C., 140° C., 150° C., 160° C., 170° C., 180° C., 190° C., to about 200° C., or any range derivable therein. In some embodiments, the method further comprises heating the first reaction mixture to a second temperature. In further embodiments, the second temperature is from about 700° C. to about 900° C., from about 750° C. to about 850° C., or from about 700° C., 725° C., 750° C., 775° C., 800° C., 825° C., 850° C., 875° C., to about 900° C., or any range derivable therein.

III. LIGHT-EMITTING DEVICES EMPLOYING THE PHOSPHORS OF THE PRESENT DISCLOSURE

In yet other aspects, the present disclosure provides light-emitting devices comprising:
a) an excitation light source that emits primary light; and
b) a phosphor of the present disclosure.

In some embodiments, the phosphor is a blue-emitting phosphor. In some embodiments, the excitation light source is a semiconductor light source, such as a light-emitting diode (LED) or a laser diode (LD). In some embodiments, the primary light has a wavelength from about 260 nm to about 450 nm, from about 380 nm to about 430 nm, or from about 260 nm, 280 nm, 300 nm, 320 nm, 340 nm, 360 nm, 380 nm, 385 nm, 390 nm, 400 nm, 405 nm, 410 nm, 420 nm, to about 430 nm, or any range derivable therein. In some embodiments, the light-emitting device further comprises a green-emitting phosphor. In some embodiments, the light-emitting device further comprises a red-emitting phosphor. In some embodiments, the light-emitting device further comprises a green-emitting phosphor and a red-emitting phosphor.

IV. DEFINITIONS

The present disclosure provides inorganic compounds comprising atoms of a plurality of elements. In the context of the present disclosure, reference to an element is intended to refer to atoms of that element in any oxidation state. A non-limiting example is the term "potassium" (i.e., K) which refers to both potassium metal (i.e., $K^0$) and potassium(I) (i.e., $K^+$).

A "repeat unit" is the simplest structural entity of certain materials, for example, frameworks and/or polymers, whether organic, inorganic or metal-organic. In the case of a polymer chain, repeat units are linked together successively along the chain, like the beads of a necklace. For example, in polyethylene, —[—$CH_2CH_2$—]$_n$—, the repeat unit is —$CH_2CH_2$—. The subscript "n" denotes the degree of polymerization, that is, the number of repeat units linked together. When the value for "n" is left undefined or where "n" is absent, it simply designates repetition of the formula within the brackets as well as the polymeric nature of the material. The concept of a repeat unit applies equally to where the connectivity between the repeat units extends three dimensionally, such as crystalline inorganic materials, metal organic frameworks, modified polymers, thermosetting polymers, etc.

The use of the word "a" or "an," when used in conjunction with the term "comprising" in the claims and/or the specification may mean "one," but it is also consistent with the meaning of "one or more," "at least one," and "one or more than one."

Throughout this application, the term "about" is used to indicate that a value includes the inherent variation of error for the device, the method being employed to determine the value, or the variation that exists among the study subjects or patients. When the term "about" is used in the context of X-ray diffraction peaks, the term is used to express variation in the peak of ±0.2° 2θ.

The terms "comprise," "have," and "include" are open-ended linking verbs. Any forms or tenses of one or more of these verbs, such as "comprises," "comprising," "has," "having," "includes," and "including," are also open-ended. For example, any method that "comprises," "has," or "includes" one or more steps is not limited to possessing only those one or more steps and also covers other unlisted steps.

The term "effective," as that term is used in the specification and/or claims, means adequate to accomplish a desired, expected, or intended result.

An "isomer" of a first compound is a separate compound in which each molecule contains the same constituent atoms as the first compound, but where the configuration of those atoms in three dimensions differs.

The above definitions supersede any conflicting definition in any reference that is incorporated by reference herein. The fact that certain terms are defined, however, should not be considered as indicative that any term that is undefined is indefinite. Rather, all terms used are believed to describe the invention in terms such that one of ordinary skill can appreciate the scope and practice the present invention.

As used herein, one or more of the following abbreviations may be used in the application: LED, light-emitting diode; pc-LED, phosphor-converted white light emitting diode; PLQY, photoluminescence quantum yield; CIE, Commission internationale de l'éclairage (i.e., International Commission on Illumination); NTSC, National Television System Committee; ITU-R, International Telecommunication Union-Radiocommunications Sector; UV, ultraviolet; $\lambda_{ex}$, excitation wavelength maximum; $\lambda_{em}$, emission wavelength maximum; nm, nanometer; h, hour; and rt, room temperature.

V. EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Example 1: Phosphors of the General Molecular Formula $A_{3-2x}Eu_xMP_3O_9N$ A. Synthesis, Characterization, and Methods $K_{2.94}Eu_{0.03}AlP_3O_9N$ was prepared via solid-state reaction starting from as-prepared $KPO_3$, $Al_2O_3$ (Sigma Aldrich, 99.99%), and $Eu_2O_3$ (Alfa Aesar, 99.99%) in the appropriate stoichiometric ratios. $KPO_3$ was obtained through the dehydration of $KH_2PO_4$ (Alfa Aesar, 99.0%) by annealing at 350° C. for 12 hours in air (Park et al., 2001). An additional 7.5 wt % of $KPO_3$ was added to compensate for any potential evaporation during synthesis. The starting reagents were ground in an acetone medium using an agate mortar and pestle and further ground for 100 minutes using a high energy ball mill (Spex 800 M Mixer/Mill). The homogenous powder was pressed into a 6 mm diameter pellet which was placed on a bed of sacrificial powder in an alumina crucible (AdValue Technology) and sintered at 150° C. for 1 hour and 800° C. for 12 hours under flowing $NH_3$ gas with a heating and cooling rate of 5° C. per minute (Marchand et al., 2000). The $NH_3$ gas acts as the nitriding agent and provides a reducing environment to reduce $Eu^{3+}$ to $Eu^{2+}$. Phase purity was confirmed by X-ray powder diffraction on a PanAnalytical X'Pert powder diffractometer using Cu Kα radiation (1.54183 Å).

The phase pure samples were deposited on a quartz slide (Chemglass) after being mixed in an optically transparent silicone resin (GE Silicones, RTV 615). Photoluminescent spectra were recorded on a Horiba Fluoromax-4 fluorescence spectrophotometer with a 150 W xenon arc lamp for excitation. Temperature-dependent emission spectra were obtained using a Janis cryostat (VPF-100) for a temperature-controlled environment from 300-640 K coupled to a PTI fluorescence spectrophotometer with a 75 W xenon arc lamp for excitation. The internal photoluminescent quantum yield was determined following the methodology of de Mello et al., 1997 and using a Spectralon coated integrating sphere (Labsphere) with an inner diameter of 150 mm.

B. Results

Figure 2:
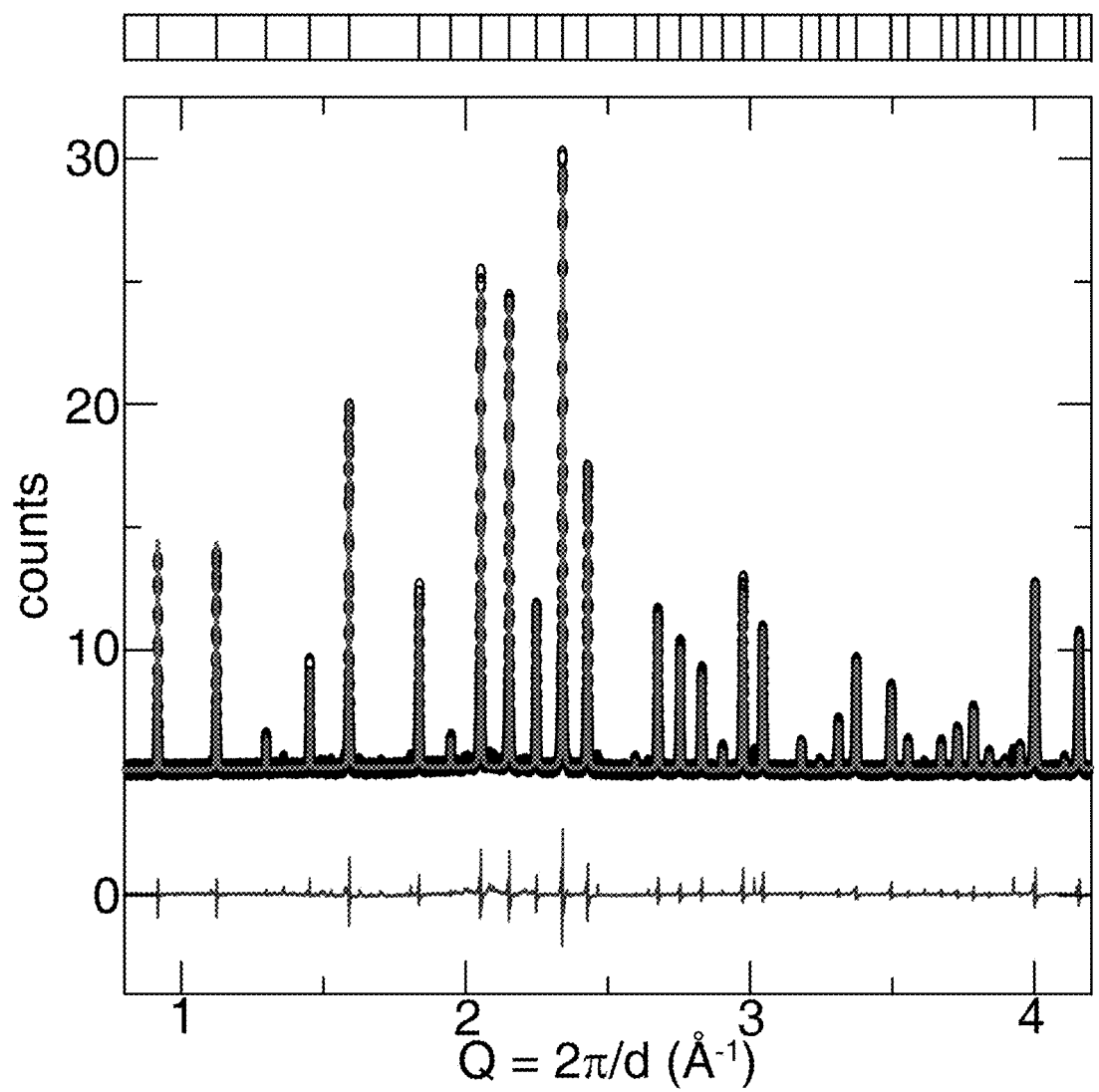
FIG. 2 shows the Rietveld refinement of high-resolution synchrotron powder X-ray diffraction of $K_{2.94}Eu_{0.03}AlP_3O_9N$.

The successful synthesis of $K_{2.94}Eu_{0.03}AlP_3O_9N$ involves the sintering of oxide precursors at moderate temperatures in a reducing ($NH_3$) environment. This direct synthetic method is highly scalable and should be capable of producing multiple grams of the product in a single reaction step. The Rietveld refinement of high-resolution synchrotron powder X-ray diffraction can be seen in FIG. 2. The refinement shows excellent aftreement with the published crystal structure of $K_3AlP_3O_9N$ t.

Figures 3A, 3B:
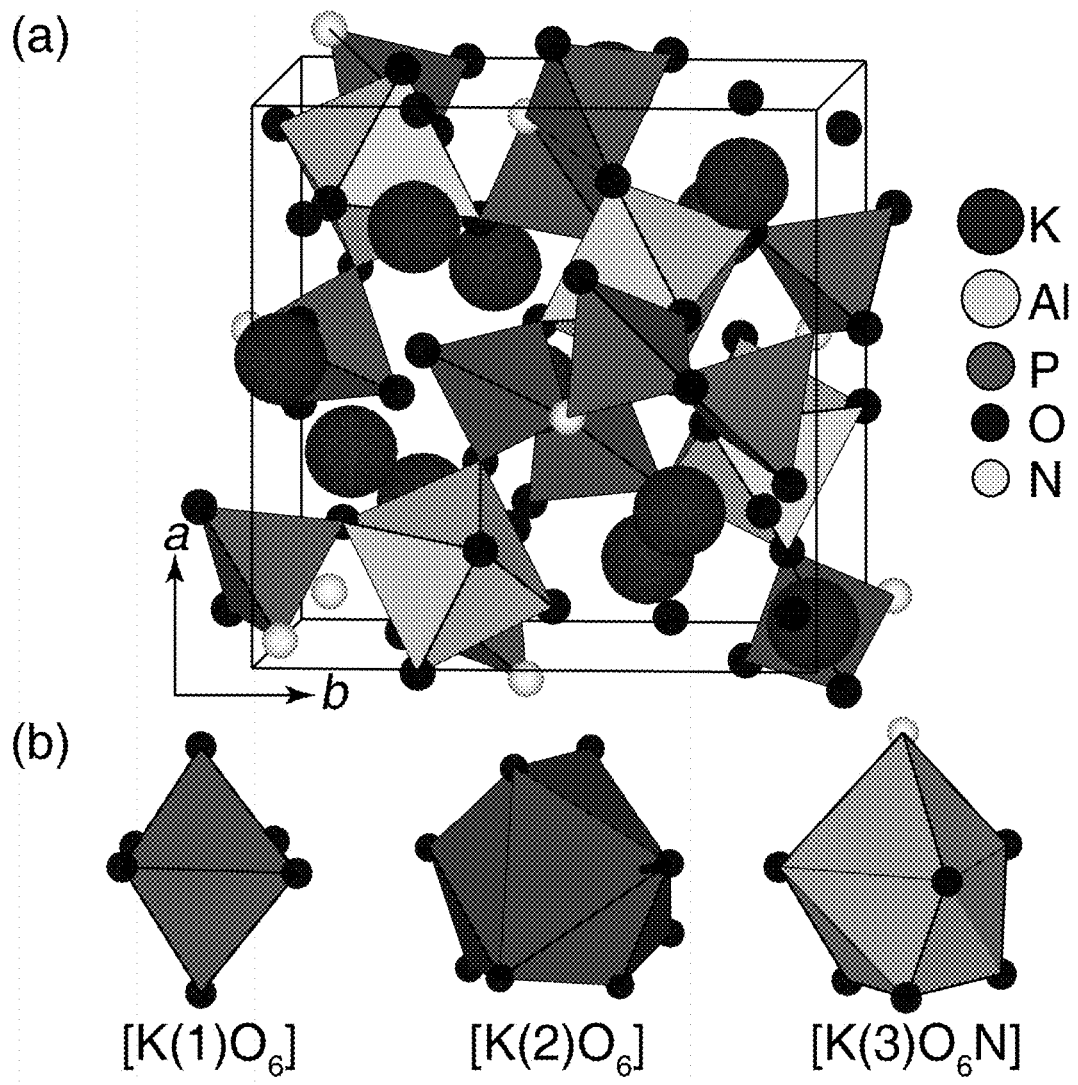
FIGS. 3A & 3B show the crystal structure detail of $K_3AlP_3O_9N$.

As illustrated in FIG. 3A, $K_3AlP_3O_9N$ crystallizes in the cubic space group P2$_1$3 (space group no. 198). The structure is composed of [AlO$_6$] octahedra that are corner-connected to six [PO$_3$N] tetrahedra which forms the backbone of the crystal structure. There are three non-equivalent K$^+$ atoms in which one is coordinated by six oxygen atoms, the second is coordinated by nine oxygen atoms, and the third K$^+$ atom is coordinated by six oxygen atoms and one nitrogen atom (FIG. 3B). The K-centered polyhedra are all face-sharing and are corner connected to the [PO$_3$N] tetrahedra. The K(1)O$_6$ octahedra face shares with the [AlO$_6$] octahedra, whereas the K(2)O$_9$ and K(3)O$_6$N polyhedra are corner-connected with [AlO$_6$]. The K$^+$ sites ($r_{6\text{-}coord}$=1.38 Å; $r_{7\text{-}coord}$=1.46 Å) are large enough to accommodate the Eu$^{2+}$ atoms ($r_{6\text{-}coord}$=1.17 Å; $r_{7\text{-}coord}$=1.20 Å) because the K$^+$ atoms are much larger than the P ($r_{4\text{-}coord}$=0.17 Å) and Al ($r_{6\text{-}coord}$=0.535 Å) cations (Shannon et al., 1976).

Figures 4A, 4B:
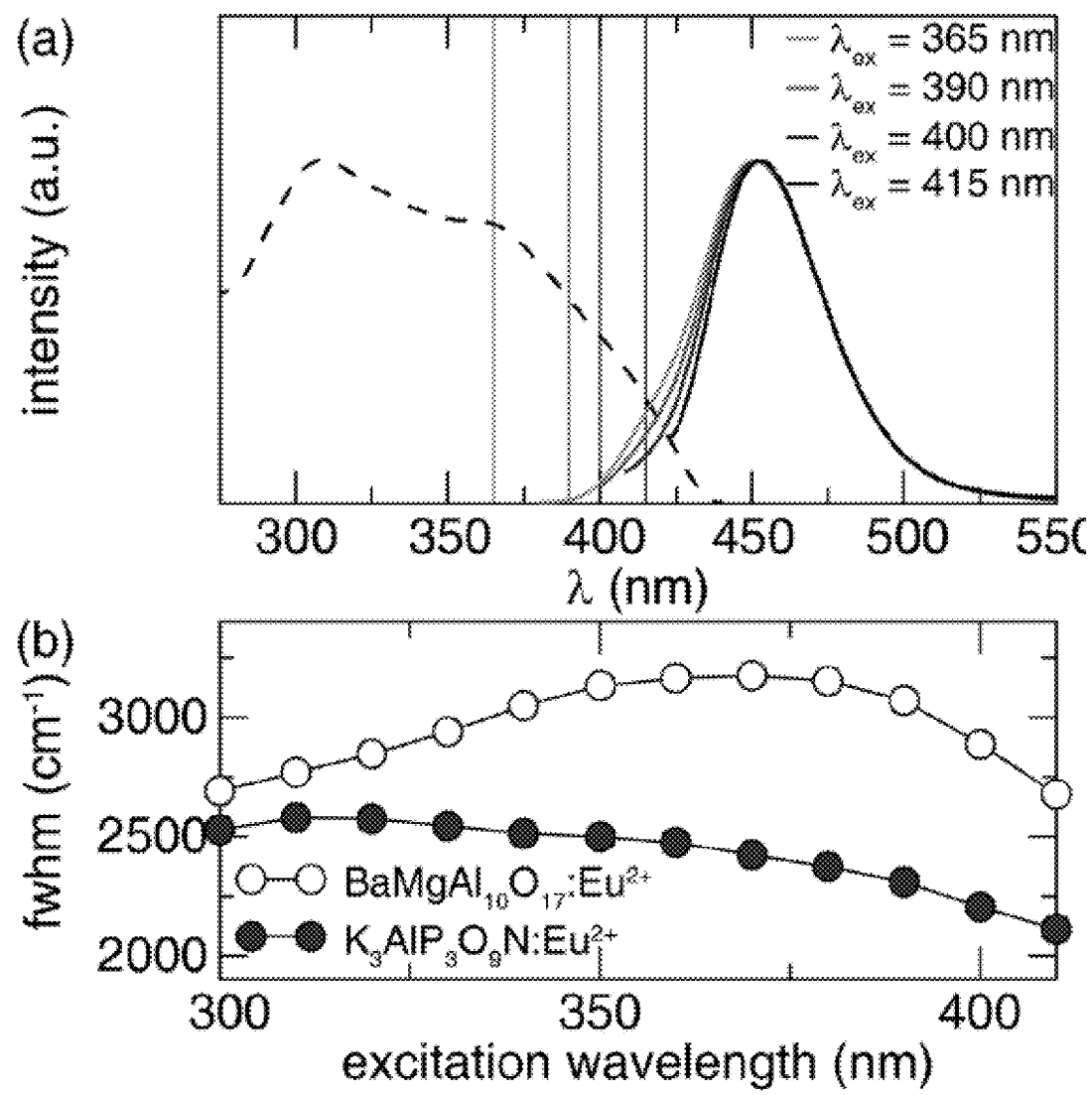
FIGS. 4A & 4B show excitation and emission spectra for $K_{2.94}Eu_{0.03}AlP_3O_9N$ and full width at half maximum curves for $K_3AlP_3O_9N:Eu^{2+}$ and $BaMgAl_{10}O_{17}:Eu^{2+}$.

Substituting Eu$^{2+}$ for K$^+$ following the nominal composition $K_{2.94}Eu_{0.03}AlP_3O_9N$ yields a bright blue emission upon excitation from 260 nm-430 nm. There are three main peaks in the excitation spectrum centered at approximately 310, 365, and 400 nm (FIG. 4A). The broad excitation range allows these phosphors to be used in various applications, depending on the excitation maximum. The presence of an explicit maximum at 400 nm indicates compatibility with violet LEDs, meaning $K_{2.94}Eu_{0.03}AlP_3O_9N$ could be used as the blue-emitter in the production of human-centric white light. The emission spectrum upon 365, 390, 400, and 415 nm can be seen in FIG. 3A. Interestingly, the emission begins to narrow significantly as the excitation wavelength increases. Therefore, the full width at half maximum (fwhm) of the emission spectrum as a function of excitation wavelength is plotted in FIG. 4B. The emission upon 300 nm excitation is broad, approximately 2500 cm$^{-1}$. This emission can be deconvoluted into three Gaussians, corresponding to Eu$^{2+}$ substitution on each of the three crystallographically independent K$^+$ sites. Increasing the excitation wavelength shows a subtle rise in the full width at half maximum, followed by a steady decrease where the emission is the narrowest, 2110 cm$^{-1}$, at 410 nm. The narrow emission is likely due to the selective excitation of Eu$^{2+}$ on a particular K$^+$ site. Interestingly, the excitation-dependent full width at half maximum of commercially purchased BaMgAl$_{10}$O$_{17}$:Eu$^{2+}$ showed the opposite trend, where the emission's full width at half maximum steadily increased by increasing the excitation wavelength from 300 nm to 380 nm. Increasing the excitation wavelength beyond 380 resulted in a slight decrease in the full width at half maximum to 2678 cm$^{-1}$ upon 410 nm excitation. The emission of K$_{2.94}$Eu$_{0.03}$AlP$_3$O$_9$N (fwhm=2110 cm$^{-1}$) is >500 cm$^{-1}$ narrower than the commercial-grade BaMgAl$_{10}$O$_{17}$:Eu$^{2+}$ (fwhm=2678 cm$^{-1}$) but is broader than SrP$_8$N$_{14}$:Eu$^{2+}$ (fwhm=1350 cm$^{-1}$) and SrLi$_2$Be$_4$O$_6$:Eu$^{2+}$ (1200 cm$^{-1}$) under 400 nm excitation. However, the need for high pressure or toxic Be precursors in the synthesis of SrP$_8$N$_{14}$:Eu$^{2+}$ and SrLi$_2$Be$_4$O$_6$:Eu$^{2+}$, respectively, inhibits the widespread use of these phosphors in commercial applications. As K$_{2.94}$Eu$_{0.03}$AlP$_3$O$_9$N can be synthesized with non-toxic, readily available elements at atmospheric pressure, this phosphor can be more easily scaled up for industrial use.

Figures 5A, 5B:
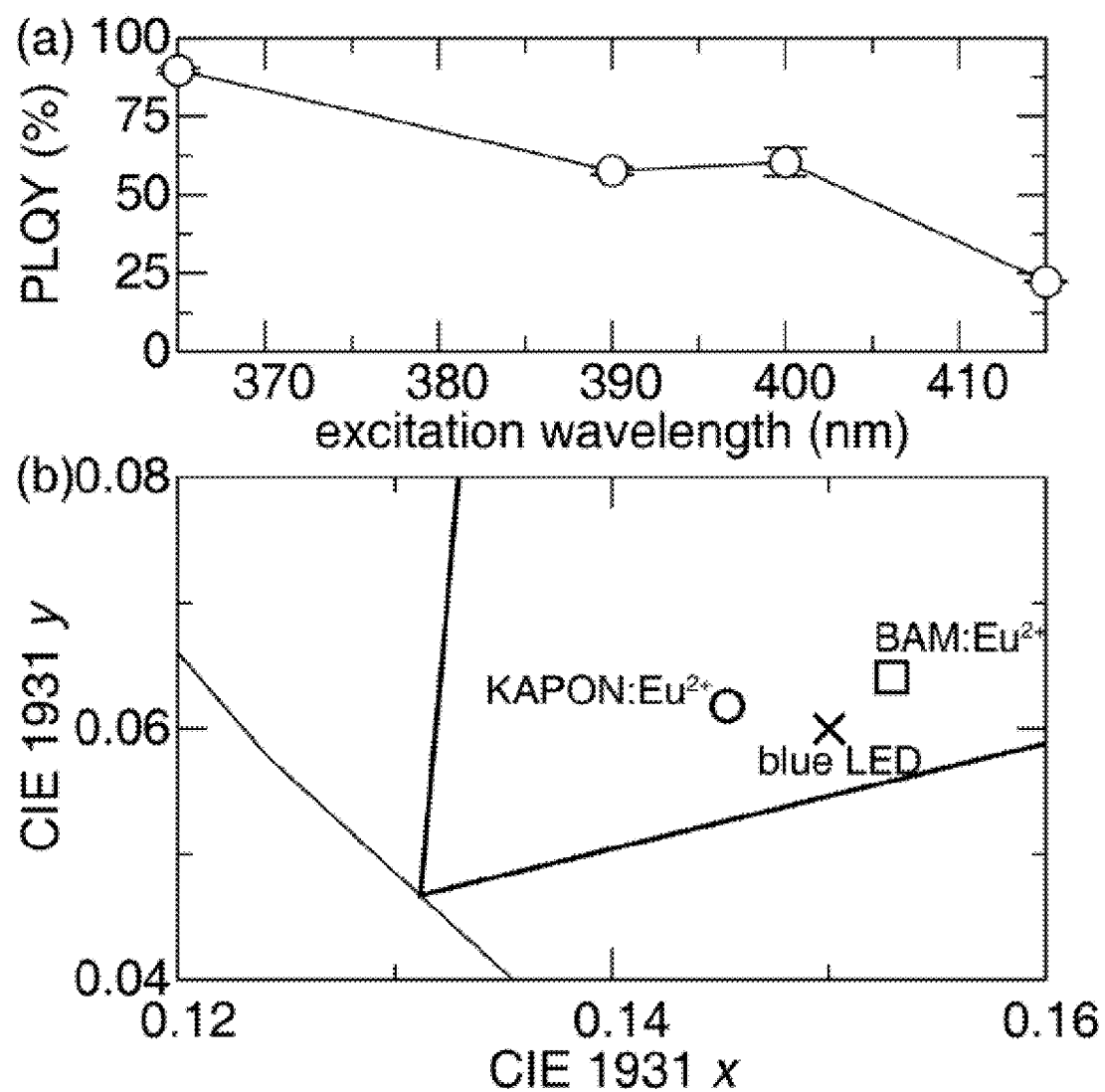
FIGS. 5A & 5B show photoluminescent quantum yield data and 1931 CIE coordinates.
Figures 6A, 6B, 6C:
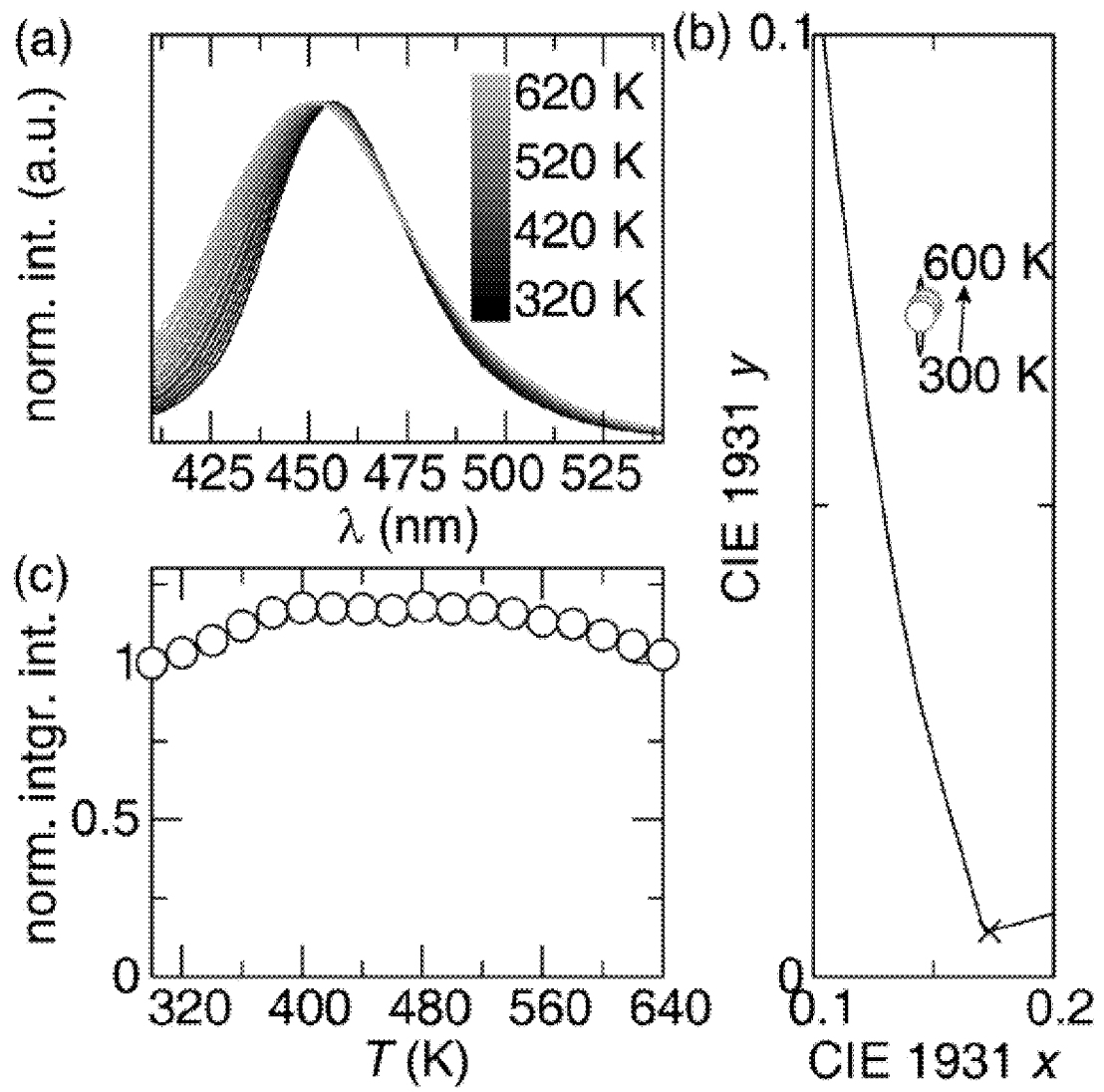
FIGS. 6A-6C show emission spectra, CIE coordinates, and the normalized integrated intensity of $K_{2.94}Eu_{0.03}AlP_3O_9N$.

Integration into LED lighting devices requires that the phosphor must also be highly efficient. Thus, the room temperature photoluminescent quantum yield (PLQY) was measured to determine the efficiency of K$_{2.94}$Eu$_{0.03}$AlP$_3$O$_9$N. As K$_{2.94}$Eu$_{0.03}$AlP$_3$O$_9$N has a broad excitation range, the PLQY was measured as a function of excitation wavelength to understand the efficiency behavior across the UV to the visible region. As seen in FIG. 5A, the PLQY upon 365 nm excitation reaches a maximum of 90%. Further increasing the excitation wavelength to 390 nm and 400 nm causes the PLQY to decrease slightly to 58% and 60%, respectively. Exciting at the longer wavelength of 415 nm causes the PLQY of K$_{2.94}$Eu$_{0.03}$AlP$_3$O$_9$N to decrease to 22%. Despite the slight loss in emission efficiency upon 400 nm excitation, it is uncommon to produce blue emission from a violet excitation source, making K$_{2.94}$Eu$_{0.03}$AlP$_3$O$_9$N unique and well-suited for devices utilizing these visible light excitation sources. The efficiency of K$_{2.94}$Eu$_{0.03}$AlP$_3$O$_9$N is also comparable to the industry standard BAM:Eu$^{2+}$. Under 365 nm excitation, BAM:Eu$^{2+}$ has a PLQY of 95%, which is very similar to the 90% in K$_{2.94}$Eu$_{0.03}$AlP$_3$O$_9$N. At 400 nm excitation, the efficiency of commercial BAM:Eu$^{2+}$ is 90% which is higher K$_{2.94}$Eu$_{0.03}$AlP$_3$O$_9$N (60%) (Hariyani et al., 2021). The PLQY of K$_{2.94}$Eu$_{0.03}$AlP$_3$O$_9$N can still be further improved through industrial post-processing techniques such as additional sintering, improved particle morphology, and surface etching, among others.

The blue emission color of the phosphor can be visualized by integrating the emission spectrum across the tri-stimulus function and plotting the obtained coordinates on a 1931 CIE diagram, as seen in FIG. 5B. K$_{2.94}$Eu$_{0.03}$AlP$_3$O$_9$N has 1931 CIE coordinates of (0.145, 0.062), which describes a deep blue color when observed by the average human eye. As a result, the CIE coordinates of K$_{2.94}$Eu$_{0.03}$AlP$_3$O$_9$N lie close to the blue corner of the Rec. 2020 triangle. Using this new blue-emitting material, the available color gamut was calculated using commercially purchased green-emitting β-SiAlON:Eu$^{2+}$ and red-emitting K$_2$SiF$_6$:Mn$^{4+}$. The gamut created from these three phosphors covers 70% of the Rec. 2020 triangle indicating that over half of the necessary color gamut is achieved when using K$_{2.94}$Eu$_{0.03}$AlP$_3$O$_9$N as the blue source. In addition, the CIE coordinates of commercial industry standard BaMgAl$_{10}$O$_{17}$:Eu$^{2+}$ and a commercial blue LED were plotted. Comparing the area of the resulting triangle created by connecting the CIE coordinates of BaMgAl$_{10}$O$_{17}$:Eu$^{2+}$-β-SiAlON:Eu$^{2+}$—K$_2$SiF$_6$:Mn$^{4+}$ and blue LED-β-SiAlON:Eu$^{2+}$—K$_2$SiF$_6$:Mn$^{4+}$ to K$_3$Al$_3$O$_9$N:Eu$^{2+}$-β-SiAlON:Eu$^{2+}$—K$_2$SiF$_6$:Mn$^{4+}$ indicates using K$_3$Al$_3$O$_9$N:Eu$^{2+}$ as the blue-emitter widens the color gamut by 2% (68% of Rec. 2020 area) and 1% (69% of Rec. 2020 area) than when utilizing BaMgAl$_{10}$O$_{17}$:Eu$^{2+}$ and a blue LED, respectively. This wider color gamut will allow for enhanced color rendering in general and display lighting applications.

When developing new phosphors for use in LED light bulbs, the phosphor must resist a loss of emission intensity and chromaticity drift at elevated temperatures. LED light bulbs operate at high temperatures (>423 K), which is sufficient to negatively impact the phosphor's emission peak shape and wavelength. Thermally robust phosphors, thus, must be identified before integration into commercial devices. The thermal stability of a phosphor is quantified by the T$_{50}$, or the temperature at which the emission intensity is 50% of the low-temperature intensity. The emission spectra of K$_{2.94}$Eu$_{0.03}$AlP$_3$O$_9$N were measured from 300-640 K and plotted in FIG. 5A. At 300 K (black), the emission peak is narrow and is centered at 454 nm. Incrementally increasing the temperature causes the emission peak to slightly blue-shift and increase in intensity. The blue shift in the emission maximum results from a slight increase in the emission full width at half maximum from 2063 cm$^{-1}$ (44 nm) to 2985 cm$^{-1}$ (60 nm). Despite the blue shift, the CIE coordinates of the emission spectrum at 300 K, 400 K, 500 K, and 600 K all fall within a three-step MacAdam ellipse centered on the 300 K CIE coordinates, seen in FIG. 5B. This result indicates that the emission color of K$_{2.94}$Eu$_{0.03}$AlP$_3$O$_9$N appears invariant to the average human eye even at the high operating temperatures of LED light bulbs, meaning K$_{2.94}$Eu$_{0.03}$AlP$_3$O$_9$N has excellent chromatic stability. The observed increase in the integrated intensity as a function of temperature, seen in FIG. 5C, is presumably due to the release of electrons from defect trap states. The trap states likely stem from a charge compensation mechanism from the aliovalent substitution of K$^+$ for Eu$^{2+}$. More importantly, the depopulation of trap states at high temperatures contributes to the observed zero thermal quenching. It is important to note that there is zero thermal quenching of the integrated emission intensity at temperatures surpassing 420 K, which is the operating temperature of most LED lights (423 K). The origin of the thermal quenching resistance can be attributed to the wide band gap (E$_g$>5 eV) and densely packed crystal structure, limiting access to non-radiative relaxation pathways. The excellent thermal stability of this phosphor makes it a promising candidate for high-powered LED lighting.

All of the compositions and methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and methods and in the steps or in the sequence of steps of the method described herein without departing from the concept, spirit and scope of the disclosure. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the disclosure as defined by the appended claims.

V. REFERENCES

The following references to the extent that they provide exemplary procedural or other details supplementary to those set forth herein, are specifically incorporated herein by reference.

Anderson, *Practical Process Research & Development—A Guide for Organic Chemists*, 2$^{nd}$ ed., Academic Press, New York, 2012.

*Handbook of Pharmaceutical Salts: Properties, and Use*, Stahl and Wermuth Eds., Verlag Helvetica Chimica Acta, 2002.

Reagan-Shaw et al., *FASEB J.*, 22(3):659-661, 2008.

Smith, *March's Advanced Organic Chemistry: Reactions, Mechanisms, and Structure*, 7$^{th}$ Ed., Wiley, 2013.

Conanec et al., *J. Solid State Chem.*, 121(2):418-422, 1996.

de Mello et al., *Adv. Mater.*, 9(3):230-232, 1997.

Duke et al., *Chem. Mater.*, 30(8):2668-2675, 2018.

Hariyani and Brgoch, *ACS Appl. Mater. Interfaces*, 13(14):16669-16676, 2021.

Liao et al., *Angew. Chem. Int. Ed.*, 57(36):11728-11731, 2018.

Marchand et al., In: Adv. Inorg. Chem., 50:193-233, 2000.

Mure et al., *Science*, 366(6470):1251-1255, 2019.

Nagare et al., *Lighting Research & Technology*, 51(3):373-383, 2019.

Nakamura et al., *Appl. Phys. Lett.*, 67(13):1868-1870, 1995.

Park et al., *J. Phys.: Condens. Matter*, 13(42):9411-9419, 2001.

Penning et al., *Energy Savings Forecast of Solid-State Lighting in General Illumination Applications*, 2016.

Prayag et al., *Clocks Sleep*, 1(1):193-208, 2019.

Schubert and Kim, *Science*, 308(5726):1274-1278, 2005.

Shannon, *Acta Crystallogr. Sect. A: Found. Crystallogr.*, A32(5):751-767, 1976.

What is claimed is:

1. A phosphor of the general molecular formula:

$$A_{3-2x}Eu_xMP_3O_9N,$$

wherein:
A is one or more alkali metal;
M is one or more elements selected from the group consisting of Al, Ga, In, Ti, V, Nb, Cr, Mn, Fe, Co, Sc, Y, La, Gd, and Lu; and

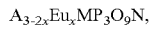

$0 < x \leq 0.25$.

2. The phosphor of claim 1, wherein A is potassium (I).
3. The phosphor of claim 1, wherein M is aluminum (III).
4. The phosphor of claim 1, wherein $0 < x \leq 0.1$, such as 0.03.
5. The phosphor of claim 1, further defined as $K_{2.94}Eu_{0.03}AlP_3O_9N$.
6. The phosphor of claim 1, wherein the phosphor at about 19° C. has an excitation spectrum peak at an excitation wavelength from about 260 nm to about 430 nm.
7. The phosphor of claim 1, wherein the phosphor has an emission spectrum peak at an emission wavelength from about 375 nm to about 600 nm.
8. The phosphor of claim 7, wherein the emission spectrum peak has a full width at half-maximum (FWHM) of from about 2600 cm$^{-1}$ to about 2000 cm$^{-1}$.
9. The phosphor of claim 7, wherein the emission spectrum peak has a full width at half-maximum (FWHM) of from about 55 nm to about 30 nm.
10. The phosphor of claim 1, wherein the phosphor at about 21° C. has a photoluminescent quantum yield (PLQY) of greater than 5%.
11. A method for producing a phosphor of claim 1, wherein the method comprises:
(a) mixing starting materials of the phosphor to produce a first reaction mixture, wherein the starting materials of the phosphor comprise one or more alkali metal sources, one or more metal sources, wherein each metal source is independently a transition metal source or a post-transition metal source, a phosphorous source, and a europium source; and
(b) heating the first reaction mixture to a first temperature for a first time period in the presence of a nitrogen source to produce the phosphor.
12. The method of claim 11, wherein the alkali metal source is a potassium source, such as a potassium salt, such as KPO$_3$.
13. The method of claim 11, wherein the metal source is a post-transition metal source, such as an aluminum source, such as Al$_2$O$_3$.
14. The method of claim 11, wherein the phosphorous source is a phosphate salt, such as KPO$_3$.
15. The method of claim 11, wherein the europium source is a europium oxide, such as Eu$_2$O$_3$.
16. The method of claim 11, wherein the first temperature is from about 100° C. to about 200° C., such as about 150° C.
17. The method of claim 11, wherein the nitrogen source is NH$_3$, PON, HPN$_2$, binary metal nitrides, (PNCl$_2$)$_3$, or Na$_2$NCN.
18. A phosphor prepared according to the method of claim 11.
19. A light-emitting device comprising:
(a) an excitation light source that emits primary light; and
(b) a phosphor of claim 1.
20. The light-emitting device of claim 19, wherein the excitation light source is a semiconductor light source.

* * * * *